(12) United States Patent
Stoddard et al.

(10) Patent No.: US 8,440,157 B2
(45) Date of Patent: May 14, 2013

(54) METHODS AND APPARATUSES FOR MANUFACTURING CAST SILICON FROM SEED CRYSTALS

(75) Inventors: Nathan G. Stoddard, Gettysburg, PA (US); Roger F. Clark, Knoxville, MD (US)

(73) Assignee: AMG Idealcast Solar Corporation, Frederick, MD (US)

( * ) Notice: Subject to any disclaimer, the term of this patent is extended or adjusted under 35 U.S.C. 154(b) by 557 days.

(21) Appl. No.: 12/669,534

(22) PCT Filed: Jul. 16, 2008

(86) PCT No.: PCT/US2008/070206
§ 371 (c)(1),
(2), (4) Date: Jan. 18, 2010

(87) PCT Pub. No.: WO2009/014963
PCT Pub. Date: Jan. 29, 2009

(65) Prior Publication Data
US 2011/0129403 A1    Jun. 2, 2011

Related U.S. Application Data

(60) Provisional application No. 60/951,155, filed on Jul. 20, 2007.

(51) Int. Cl.
*C01B 33/02* (2006.01)
(52) U.S. Cl.
USPC ........................................... 423/349

(58) Field of Classification Search ........... 423/348–350
See application file for complete search history.

(56) References Cited

U.S. PATENT DOCUMENTS

| | | | |
|---|---|---|---|
| 3,581,804 A | 6/1971 | Woltering |
| 3,653,432 A | 4/1972 | Schmid et al. |
| 3,664,411 A | 5/1972 | Carver et al. |
| 3,898,051 A | 8/1975 | Schmid |
| 4,075,055 A | 2/1978 | Ciszek et al. |
| 4,094,621 A | 6/1978 | Hehl |
| 4,101,624 A | 7/1978 | Johnson et al. |
| 4,175,610 A | 11/1979 | Zauhar et al. |
| 4,382,838 A | 5/1983 | Authier |

(Continued)

FOREIGN PATENT DOCUMENTS

| | | |
|---|---|---|
| CN | 1473968 | 2/2004 |
| CN | 1485467 | 3/2004 |

(Continued)

OTHER PUBLICATIONS

D. N. Jewett et al., "Low Cost Solar Array Project. Task I. Silicon Material. Gaseous Melt Replenishment System. Fifth Quarterly Progress Report, Apr. 17-Jul. 17, 1980," Energy Materials Corp., Harvard, MA.

(Continued)

*Primary Examiner* — Colleen Dunn
(74) *Attorney, Agent, or Firm* — Barnes & Thornburg LLP; Thomas J. McWilliams; Edward F. Behm, Jr.

(57) ABSTRACT

Methods and apparatuses are provided for casting silicon for photovoltaic cells and other applications. With these methods, an ingot can be grown that is low in carbon and whose crystal growth is controlled to increase the cross-sectional area of seeded material during casting.

3 Claims, 10 Drawing Sheets

U.S. PATENT DOCUMENTS

| | | | |
|---|---|---|---|
| 4,834,166 A | 5/1989 | Nakano | |
| 5,108,720 A | 4/1992 | Bourbina et al. | |
| 5,205,872 A | 4/1993 | Mitsunori et al. | |
| 5,211,802 A | 5/1993 | Kaneko et al. | |
| 5,229,082 A | 7/1993 | Seidensticker et al. | |
| 5,242,531 A | 9/1993 | Klingshirn et al. | |
| 5,264,070 A | 11/1993 | Urquhart et al. | |
| 5,324,488 A | 6/1994 | Klingshirn et al. | |
| 5,340,410 A | 8/1994 | Endroes et al. | |
| 5,363,796 A | 11/1994 | Kobayashi et al. | |
| 5,363,799 A | 11/1994 | Yonehara et al. | |
| 5,431,869 A | 7/1995 | Kumar et al. | |
| 5,443,032 A | 8/1995 | Vichr et al. | |
| 5,549,746 A | 8/1996 | Scott et al. | |
| 5,614,019 A | 3/1997 | Vichr et al. | |
| 5,707,744 A | 1/1998 | King et al. | |
| 5,714,004 A | 2/1998 | Okuno | |
| 5,753,038 A | 5/1998 | Vichr et al. | |
| 5,759,879 A | 6/1998 | Iwasaki | |
| 5,800,611 A | 9/1998 | Christensen | |
| 5,827,773 A | 10/1998 | Voutsas | |
| 5,944,890 A | 8/1999 | Kitou et al. | |
| 5,959,314 A | 9/1999 | Voutsas | |
| 6,027,563 A | 2/2000 | Choudhury et al. | |
| 6,106,614 A | 8/2000 | Stephens et al. | |
| 6,106,739 A | 8/2000 | Stephens et al. | |
| 6,120,602 A | 9/2000 | Stephens et al. | |
| 6,136,091 A | 10/2000 | Yamazaki et al. | |
| 6,171,393 B1 | 1/2001 | Kurosaka et al. | |
| 6,334,603 B1 | 1/2002 | Wakita et al. | |
| 6,342,312 B2 | 1/2002 | Oba et al. | |
| 6,635,555 B2 | 10/2003 | Voutsas | |
| 6,664,147 B2 | 12/2003 | Voutsas | |
| 6,686,978 B2 | 2/2004 | Voutsas | |
| 6,732,992 B2 | 5/2004 | Wakita et al. | |
| 6,769,473 B1 | 8/2004 | Adachi et al. | |
| 6,805,745 B2 | 10/2004 | Snyder et al. | |
| 6,818,484 B2 | 11/2004 | Voutsas | |
| 6,846,539 B2 | 1/2005 | Kim et al. | |
| 6,851,466 B2 | 2/2005 | Adachi et al. | |
| 6,869,477 B2 | 3/2005 | Haga et al. | |
| 6,913,649 B2 | 7/2005 | Voutsas et al. | |
| 6,926,876 B2 | 8/2005 | Kelsey | |
| 7,001,543 B2 | 2/2006 | Kitahara et al. | |
| 2002/0014574 A1 | 2/2002 | Wakita et al. | |
| 2002/0100410 A1 | 8/2002 | Kim et al. | |
| 2002/0117666 A1 | 8/2002 | Voutsas | |
| 2002/0117718 A1 | 8/2002 | Voutsas | |
| 2002/0118317 A1 | 8/2002 | Voutsas | |
| 2002/0119644 A1 | 8/2002 | Voutsas | |
| 2002/0174825 A1 | 11/2002 | Wehrhan | |
| 2003/0025134 A1 | 2/2003 | Voutsas | |
| 2003/0029376 A1 | 2/2003 | Snyder et al. | |
| 2003/0047130 A1 | 3/2003 | Sreedharamurthy et al. | |
| 2003/0064551 A1 | 4/2003 | Voutsas | |
| 2003/0080451 A1 | 5/2003 | Kitahara et al. | |
| 2003/0101924 A1 | 6/2003 | Holder | |
| 2003/0133853 A1 | 7/2003 | Kelsey | |
| 2003/0209186 A1 | 11/2003 | Haga et al. | |
| 2003/0217689 A1 | 11/2003 | Asami | |
| 2004/0129201 A1 | 7/2004 | Cho et al. | |
| 2004/0211496 A1 | 10/2004 | Khattak et al. | |
| 2004/0238150 A1 | 12/2004 | Adachi et al. | |
| 2004/0261691 A1 | 12/2004 | Doguchi | |
| 2005/0072976 A1 | 4/2005 | Cleeves et al. | |
| 2005/0120944 A1 | 6/2005 | Hong et al. | |
| 2005/0150445 A1 | 7/2005 | Kim et al. | |
| 2005/0211408 A1 | 9/2005 | Bullied et al. | |
| 2005/0221569 A1 | 10/2005 | Nakata | |
| 2006/0280945 A1 | 12/2006 | Pribat | |
| 2007/0028835 A1 | 2/2007 | Yamauchi et al. | |

FOREIGN PATENT DOCUMENTS

| | | |
|---|---|---|
| DE | 39 29 635 A1 | 3/1991 |
| DE | 10 2006 017622 | 10/2007 |
| EP | 0 233 452 | 8/1987 |
| EP | 0 399 054 B1 | 11/1990 |
| EP | 0 450 494 A1 | 10/1991 |
| EP | 0 573 943 B1 | 12/1993 |
| EP | 0 745 707 A1 | 12/1996 |
| EP | 0 748 884 A1 | 12/1996 |
| EP | 0 781 866 A2 | 7/1997 |
| EP | 0 782 178 B1 | 7/1997 |
| EP | 0 949 358 A2 | 10/1999 |
| EP | 1 384 538 A1 | 1/2004 |
| EP | 1 580 306 A2 | 9/2005 |
| EP | 0 887 442 B1 | 12/2005 |
| FR | 2 824 847 A1 | 11/2002 |
| GB | 2 279 585 A | 1/1995 |
| JP | 57-192219 | 11/1982 |
| JP | 62-167213 | 7/1987 |
| JP | 1317188 | 12/1989 |
| JP | 03103386 | 4/1991 |
| JP | 5117091 | 5/1993 |
| JP | 5279170 | 10/1993 |
| JP | 5319972 | 12/1993 |
| JP | 6-191820 | 7/1994 |
| JP | 06298588 | 10/1994 |
| JP | 7053294 | 2/1995 |
| JP | 7069778 | 3/1995 |
| JP | 7138011 | 5/1995 |
| JP | 7172998 | 7/1995 |
| JP | 8104590 | 4/1996 |
| JP | 9208374 | 8/1997 |
| JP | 9235181 | 9/1997 |
| JP | 09295887 | 11/1997 |
| JP | 10 007493 A | 1/1998 |
| JP | 10007488 | 1/1998 |
| JP | 10072292 | 3/1998 |
| JP | 10 194718 A | 7/1998 |
| JP | 10-203899 | 8/1998 |
| JP | 10-265296 | 8/1998 |
| JP | 11092284 | 4/1999 |
| JP | 11-240710 | 9/1999 |
| JP | 2000-119089 | 4/2000 |
| JP | 2000-169281 | 6/2000 |
| JP | 2001-019591 | 1/2001 |
| JP | 2001-198648 | 7/2001 |
| JP | 2002-220296 | 8/2002 |
| JP | 2003-212691 | 7/2003 |
| JP | 2005046851 | 2/2005 |
| JP | 2005046866 | 2/2005 |
| JP | 2005-095924 | 4/2005 |
| JP | 2005-104743 | 4/2005 |
| JP | 2005-152987 | 6/2005 |
| JP | 2005-211937 | 8/2005 |
| JP | 2005-281068 | 10/2005 |
| JP | 2005-350317 | 12/2005 |
| JP | 2006-83024 | 3/2006 |
| JP | 2006-131433 | 5/2006 |
| JP | 2006-182626 | 7/2006 |
| JP | 2006-219352 | 8/2006 |
| JP | 2007-076928 | 3/2007 |
| TW | 224866 | 12/2004 |
| WO | WO 01/63022 A2 | 8/2001 |
| WO | WO 01/68957 A1 | 9/2001 |
| WO | WO 02/059400 A2 | 8/2002 |
| WO | WO 03/021011 A1 | 3/2003 |
| WO | WO 03/044249 A1 | 5/2003 |
| WO | WO 03/106012 A1 | 12/2003 |
| WO | WO 2006/005416 | 1/2006 |
| WO | WO 2006093099 | 9/2006 |

OTHER PUBLICATIONS

M. Kitamura et al., "Growth of Multicrystalline Si with Controlled Grain Boundary Configuration by the Floating Zone Technique," Journal of Crystal Growth, vol. 280, 2005, pp. 419-424.

I. Perichaud et al., "Microstructure and Electrical Properties of Some Multicyrstalline Silicon Billets Continuously Cast in a Cold Crucible," Diffusion and Defect Data Part B (Solid State Phenomena) conference Title: Diffus. Defect Data B. Solid State Phenom. (Switzerland), vol. 51-52, 1996, pp. 473-477.

K. Shibuya et al., "Development of a Rapid Solidification Process with a Double-Roller Method," Material Science and Engineering, vol. 98, Feb. 1988; pp. 25-28.

J.S. Shin et al., "Numerical and Experimental Study of the Electromagnetic Continuous Casting of Silicon," Materials Science Forum Conference Title: Mater. Sci. Forum (Switzerland), vol. 475-479, pt. 4, 2005, pp. 2671-2674.

T.F. Ciszek, "Some Applications of Cold Crucible Technology for Silicon Photovoltaic Material Preparation," Journal of Electrochemical Society, vol. 132, No. 4, Apr. 1985, pp. 963-968.

Yajun Chen et al., "Growth Mechanism of Column Crystals in Directional Solidification," Journal of Tsinghua University (Science and Technology), vol. 44, No. 11, Nov. 4, 2004, pp. 1464-1467.

T.F. Ciszek et al., "Directionally Solidified Solar-Grade Silicon Using Carbon Crucibles," Journal of Crystal Growth, vol. 46, 1979, pp. 527-533.

G. Dour et al., "Relaxation of Thermal Stresses by Dislocation Flow and Multiplication in the Continuous Casting of Silicon," Modelling and Simulation in Materials Science and Engineering, vol. 5, No. 3, May 1997, pp. 275-288.

F. Durand, "Electromagnetic Continuous Pulling Process Compared to Current Casting Processes with Respect to Solidification Characteristics," Solar Energy Materials and Solar Cells, vol. 72, No. 1-4, pp. 125-132, 2002.

Shinji Goda et al., "Production of low Cost Silicon Wafers by Continuous Casting Method—Development of Drip Controlled Method," 1994 IEEE First World Conference on Photovoltiac Energy Conversion Conference Record of the IEEE Photovoltaic Specialists, Conference v 2 1994, pp. 1227-1233.

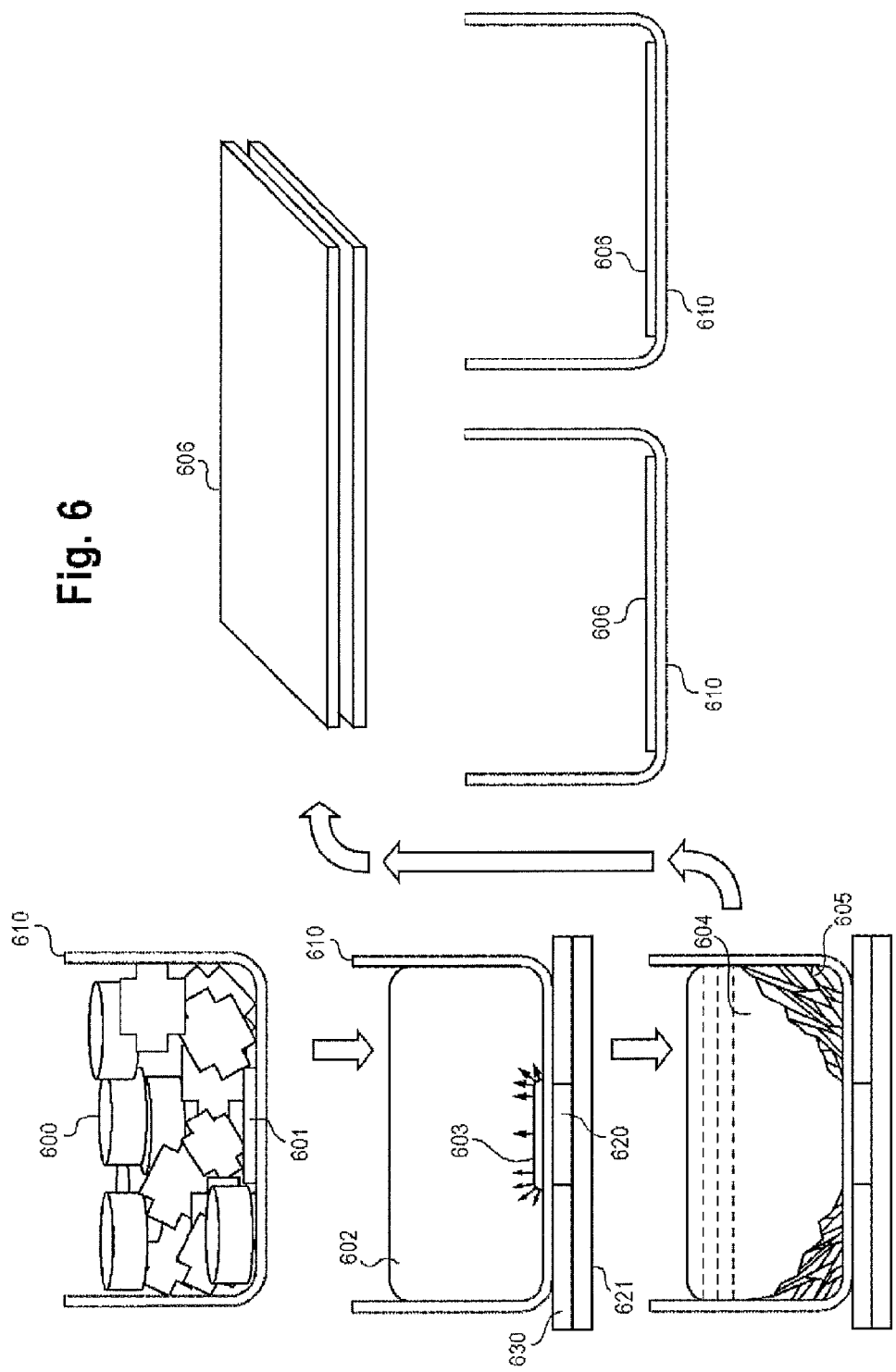

METHODS AND APPARATUSES FOR MANUFACTURING CAST SILICON FROM SEED CRYSTALS

This application claims the benefit of U.S. Provisional Application No. 60/951,155, filed Jul. 20, 2007. The entire disclosure of U.S. Provisional Application No. 60/951,155 is hereby incorporated by reference into this specification.

TECHNICAL FIELD

The present invention generally relates to the field of photovoltaics and to methods and apparatuses for manufacturing cast silicon for photovoltaic applications. The invention further relates to new forms of cast silicon that can be used to manufacture devices, such as photovoltaic cells and other semiconductor devices. The new silicon can have a monocrystalline, near-monocrystalline, bi-crystal, or geometric multicrystalline structure and can be manufactured by a casting process utilizing seed crystals.

BACKGROUND INFORMATION

Photovoltaic cells convert light into electric current. One of the most important features of a photovoltaic cell is its efficiency in converting light energy into electrical energy. Although photovoltaic cells can be fabricated from a variety of semiconductor materials, silicon is generally used because it is readily available at reasonable cost, and because it has a suitable balance of electrical, physical, and chemical properties for use in fabricating photovoltaic cells.

In a known procedure for the manufacture of photovoltaic cells, silicon feedstock is doped with a dopant having either a positive or negative conductivity type, melted, and then crystallized by either pulling crystallized silicon out of a melt zone into ingots of monocrystalline silicon (via the Czochralski (CZ) or float zone (FZ) methods), or cast into blocks or "bricks" of multi-crystalline silicon or polycrystalline silicon, depending on the grain size of the individual silicon grains. As used herein, the term "monocrystalline silicon" refers to a body of single crystal silicon, having one consistent crystal orientation throughout. Further, conventional multicrystalline silicon refers to crystalline silicon having centimeter scale grain size distribution, with multiple randomly oriented crystals located within a body of multi-crystalline silicon. As used herein, however, the term "geometrically ordered multicrystalline silicon" (hereinafter abbreviated as "geometric multicrystalline silicon") refers to crystalline silicon, according to embodiments of the present invention, having a geometrically ordered centimeter scale grain size distribution, with multiple ordered crystals located within a body of multi-crystalline silicon. For example, in geometric multicrystalline silicon, the grains are typically an average of about 0.5 cm to about 5 cm in size, and grain orientation within a body of geometric multi-crystalline silicon is controlled according to predetermined orientations.

Further, as used herein, the term "polycrystalline silicon" refers to crystalline silicon with micrometer scale grain size and multiple grain orientations located within a given body of crystalline silicon. For example, the grains are typically an average of about submicron to about micron in size (e.g., individual grains are not visible to the naked eye), and grain orientation distributed randomly throughout. In the procedure described above, the ingots or blocks are cut into thin substrates, also referred to as wafers, by known slicing or sawing methods. These wafers may then be processed into photovoltaic cells.

Monocrystalline silicon for use in the manufacture of photovoltaic cells is generally produced by the CZ or FZ methods, both being processes in which a cylindrically shaped boule of crystalline silicon is produced. For a CZ process, a seed crystal is touched to a pool of molten silicon and the boule is slowly pulled out of the pool while heat is extracted through the solid part of the boule. As used herein, the term "seed crystal" refers to a piece of crystalline material that is brought in contact with liquid silicon such that, during solidification, the liquid silicon adapts to the crystallinity of the seed. For a FZ process, solid material is fed through a melting zone, melted upon entry into one side of the melting zone, and re-solidified on the other side of the melting zone, generally by contacting a seed crystal.

Recently, a new technique for producing monocrystalline or geometric multicrystalline material in a casting station has been invented, as disclosed in U.S. patent application Ser. Nos. 11/624,365 and 11/624,411 and published as U.S. Patent Application Publication Nos. 20070169684A1 and 20070169685A1, filed Jan. 18, 2007. Casting processes for preparing multicrystalline silicon ingots are known in the art of photovoltaic technology. Briefly, in such processes, molten silicon is contained in a crucible, such as a quartz crucible, and is cooled in a controlled manner to permit the crystallization of the silicon contained therein. The block of cast crystalline silicon that results is generally cut into bricks having a cross-section that is the same as or close to the size of the wafer to be used for manufacturing a photovoltaic cell, and the bricks are sawn or otherwise cut into such wafers. Multi-crystalline silicon produced in such manner is an agglomeration of crystal grains where, within the wafers made therefrom, the orientation of the grains relative to one another is effectively random. Monocrystalline or geometric multicrystalline silicon has specifically chosen grain orientations and (in the latter case) grain boundaries, and can be formed by the new casting techniques disclosed in the above-mentioned patent applications by bringing liquid silicon in contact with a large seed layer that remains partially solid during the process and through which heat is extracted during solidification. As used herein, the term 'seed layer' refers to a crystal or group of crystals with desired crystal orientations that form a continuous layer. They can be made to conform with one side of a crucible for casting purposes.

In order to produce the best quality cast ingots, several conditions should be met. Firstly, as much of the ingot as possible have the desired crystallinity. If the ingot is intended to be monocrystalline, then the entire usable portion of the ingot should be monocrystalline, and likewise for geometric multicrystalline material. Secondly, the silicon should contain as few imperfections as possible. Imperfections can include individual impurities, agglomerates of impurities, intrinsic lattice defects and structural defects in the silicon lattice, such as dislocations and stacking faults. Many of these imperfections can cause a fast recombination of electrical charge carriers in a functioning photovoltaic cell made from crystalline silicon. This can cause a decrease in the efficiency of the cell.

Many years of development have resulted in a minimal amount of imperfections in well-grown CZ and FZ silicon. Dislocation free single crystals can be achieved by first growing a thin neck where all dislocations incorporated at the seed are allowed to grow out. The incorporation of inclusions and secondary phases (for example silicon nitride, silicon oxide or silicon carbide particles) is avoided by maintaining a counter-rotation of the seed crystal relative to the melt. Oxygen incorporation can be minimized using FZ or Magnetic CZ techniques as is known in the industry. Metallic impurities are generally minimized by being left in the potscrap or the tang end after the boule is brought to an end.

SUMMARY OF THE INVENTION

According to some embodiments, this invention relates to a method and apparatus for improved casting of materials for solar cells, such as silicon. The invention desirably utilizes a lid and/or flowing of an inert gas to improve the purity of cast silicon, such as silicon having very low carbon concentrations. Lower impurities reduce the number of foreign particles included in the ingots (termed inclusions) and improve yields of the wafers and/or solar cells. An additional benefit to silicon having increased purity includes more and/or greater monocrystalline material from the same ingot. Less impurities in the silicon also allows for faster crystal growth. Additionally, a low carbon content enables a greater variety of thermal processes for turning the wafer into a solar cell.

Conventional silicon casting processes result in a supersaturation of carbon. In contrast, some embodiments of this invention have carbon levels below the saturation limit and desirably well below the saturation limit. Operating life for carbon components of and/or within the furnace can be increased, since the inert gas exhausts the SiO molecules, and controlling the exhaust path can decrease the exposure of the carbon components to the SiO gas.

As used herein, the term "near-monocrystalline silicon" refers to a body of crystalline silicon, having one consistent crystal orientation throughout for greater than 50% by volume of the body, where, for example, such near-monocrystalline silicon may comprise a body of single crystal silicon next to a multicrystalline region, or it may comprise a large, contiguously consistent crystal of silicon that partially or wholly contains smaller crystals of silicon of other crystal orientations, where the smaller crystals do not make up more than 50% of the overall volume. Preferably, the near-monocrystalline silicon may contain smaller crystals which do not make up more than 25% of the overall volume. More preferably, the near-monocrystalline silicon may contain smaller crystals which do not make up more than 10% of the overall volume. Still more preferably, the near-monocrystalline silicon may contain smaller crystals which do not make up more than 5% of the overall volume.

As used herein, the term "bi-crystal silicon" refers to a body of silicon, having one consistent crystal orientation throughout for greater than or equal to 50% by volume of the body, and another consistent crystal orientation for the remainder of the volume of the body. For example, such bi-crystal silicon may comprise a body of single crystal silicon having a one crystal orientation next to another body of single crystal silicon having a different crystal orientation making up the balance of the volume of crystalline silicon. Preferably, the bi-crystal silicon may contain two discrete regions within the same body of silicon, the regions differing only in their crystal orientation.

In accordance with the invention as embodied and broadly described, there is provided a method of manufacturing cast silicon, comprising: placing a crucible filled with silicon on a layer, the layer comprising: a thermally conducting material in contact with a heat sink, and a thermally insulating area, where a thermally conductive part of the layer is in contact with about 5% to about 99% of a bottom surface of the crucible; and solidifying the silicon by extracting heat through the thermally conducting layer. The heat extraction may occur after part or all of the silicon is melted, in order to direct seeded growth by bringing the cast silicon to a first temperature and then cooling it to a second temperature.

In accordance with the present invention, there is also provided a method of manufacturing cast silicon, comprising placing silicon in a crucible having walls tapered inwards towards a center of the crucible, melting the silicon, solidifying the silicon by extraction of heat through a bottom of the crucible, bringing the cast silicon to a first temperature, cooling the silicon down to a second temperature different from the first temperature, extracting the cast silicon from the crucible and then cutting sections from the cast silicon.

In accordance with the present invention, there is also provided a method of manufacturing cast silicon, comprising placing silicon in a crucible having walls tapered outwards away from a center of the crucible, melting the silicon, solidifying the silicon by extraction of heat through a bottom of the crucible, bringing the cast silicon to a first temperature, cooling the silicon down to a second temperature different from the first temperature, extracting the cast silicon from the crucible and then cutting sections from the cast silicon.

In accordance with the present invention, there is also provided a crucible for the casting of silicon having a bottom surface and a plurality of side walls, wherein at least one of the plurality of side walls tapers inwards toward a center of the crucible at an angle from about 1° to about 25° with respect to a plane perpendicular to a bottom surface of the crucible and viewed in a direction extending upwards from the bottom surface. The tapered side wall or walls may reduce the vessel cross-sectional area taken in the direction away from the bottom surface.

In accordance with the present invention, there is also provided a crucible for the casting of silicon having a bottom surface and a plurality of side walls, wherein at least one of the plurality of side walls tapers outwards from a center of the crucible at an angle greater than about 2°, with respect to a plane perpendicular to a bottom surface of the crucible and viewed in a direction extending upwards from the bottom surface. The tapered side wall or walls may increase the vessel cross-sectional area taken in the direction away from the bottom surface.

In accordance with the present invention, there is also provided a method of manufacturing cast silicon, comprising: coating inner side walls of a crucible with a release coating, leaving a bottom wall uncoated; placing silicon seed crystals in contact with the uncoated wall, placing silicon feedstock in the crucible, melting the feedstock while maintaining the seed crystals in at least a partially solid state, solidifying the silicon by extracting heat through the seed crystals, bringing silicon to a first temperature and cooling the silicon to a second temperature.

In accordance with the present invention, there is also provided a method of manufacturing cast silicon, comprising: slicing a previously cast ingot into slabs, chemically treating the slabs to remove impurities, placing the slab in a crucible for use as a seed layer and then filling the crucible with feedstock for casting.

In accordance with the present invention, there is also provided a method of manufacturing cast silicon, comprising: placing a layer of monocrystalline silicon seed crystals on at least one surface in a crucible such that seed crystals in a center region of the layer have one crystal pole direction perpendicular to the surface and cover about 50% to about 99% of the layer area, while the remaining seed crystals on the edges of the layer have at least one different crystal pole direction perpendicular to the surface and cover the remaining layer area; adding feedstock silicon and bringing the feedstock and a portion of the seed layer to a molten state; solidifying the silicon by extracting heat through the seed layer; bringing the silicon to a predetermined, for example, uniform first temperature and then preferably uniformly cooling the silicon down to a uniform second temperature.

In accordance with the present invention, there is also provided a method of manufacturing cast silicon, comprising: placing at least one monocrystalline seed crystal having at least about 10 cm by about 10 cm area on a bottom surface of a crucible that rests on a partially insulating base plate; introducing solid or liquid silicon feedstock and partially melting the seed crystal, extracting heat through the seed crystal in such a way that a convex solid boundary increases the cross-sectional area of monocrystalline growth; bringing the silicon to a first temperature and cooling it, preferably uniformly, down to a second temperature; cutting a slab from a side of the cast silicon opposite the seed crystal; cleaning the slab using a chemical process; and using the large slab as a new seed layer for a subsequent casting process.

In accordance with the present invention, there is also provided a method of manufacturing cast silicon, comprising: loading a seed layer of crystalline silicon together with solid silicon feedstock into a crucible having a lid or cover; melting and solidifying the silicon while maintaining part of the seed layer as solid and while flowing at least one of argon and nitrogen gas through at least one hole in the lid or cover while at least another hole exits the gas; and cooling the silicon preferably uniformly.

In accordance with the present invention, there is also provided a method of manufacturing cast silicon, comprising: loading a seed layer of crystalline silicon into a crucible, covering the crucible having a lid; introducing liquid silicon into the crucible, the liquid silicon preferably being superheated; allowing part of the seed layer to melt; solidifying the silicon while flowing at least one of argon and nitrogen gas through at least one hole in the lid while at least one other hole exits the gas; and cooling the silicon.

In accordance with the present invention, there is also provided a process for manufacturing cast silicon comprising loading a seed layer of crystalline silicon together with solid feedstock; melting the feedstock and part of the seed layer while maintaining a solid/liquid interface that is essentially flat over a center portion of the seed layer, and convex at the edges of the seed layer; solidifying the silicon by extracting heat through the seed layer while at least initially maintaining the same solid/liquid interface shape; bringing the silicon to a first temperature and cooling the silicon to a second temperature, the heating and cooling preferably being uniform.

In accordance with the present invention, there is also provided a process for manufacturing cast silicon comprising loading a seed layer of crystalline silicon together with solid feedstock; melting the feedstock and part of the seed layer while maintaining a solid/liquid interface that is substantially flat over the entire seed layer; solidifying the silicon by extracting heat through the seed layer while at least initially providing extra heat in a region comprising the edges of the seed layer; bringing the silicon to a first temperature and preferably uniformly cooling the silicon to a second temperature, the heating and cooling preferably being uniform.

In accordance with the present invention, there is also provided an apparatus for the casting of silicon comprising heaters surrounding a crucible resting on a heat sink, the heaters being provided for the melting of silicon; a means for controlled extraction of heat through the heat sink; a port for introduction of a gas; and at least one loop of insulated, water cooled tube residing with the primary heaters and encircling the crucible, wherein the loop can be energized to provide inductive heating at different regions within the crucible.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention. In the drawings:

FIG. 6 illustrates an exemplary method for creating large single crystal seed layers, according to an embodiment of the present invention;

DESCRIPTION OF THE EMBODIMENTS

Figure 1A:
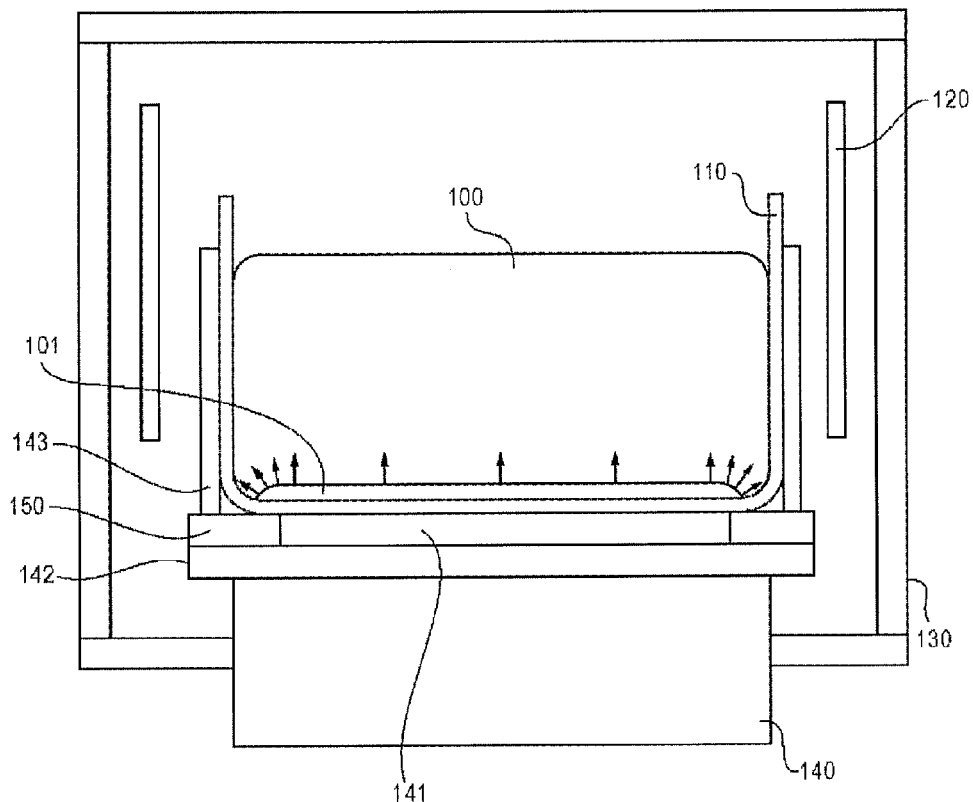
FIGS. 1A-1B illustrate an exemplary system where a thermally insulating layer is combined with a thermally conducting layer below a crucible in a casting station, according to an embodiment of the present invention.

Reference will now be made in detail to embodiments of the present invention, examples of which are illustrated in the accompanying drawings. Wherever possible, the same or similar reference numbers will be used throughout the drawings to refer to the same or like parts.

In embodiments consistent with the invention, the crystallization of molten silicon is conducted by casting processes using seed crystals. As disclosed herein, such casting processes may be implemented so that the size, shape, and orientation of crystal grains in the cast body of crystallized silicon is controlled. As used herein, the term "cast" means that the silicon is formed by cooling molten silicon in a mold or vessel used to hold the molten silicon. By way of example, the silicon can be formed by solidification in a crucible, where solidification is initiated from at least one wall of the crucible, and not through a cooled foreign object drawing silicon out of the crucible. Thus, the crystallization of molten silicon is not controlled by "pulling" a boule either by moving a seed or moving the mold, vessel, or crucible. Further, consistent with an embodiment of the present invention, the mold, vessel, or crucible includes at least one hot side wall surface for solidifying the molten silicon. As used herein, the term "hot-wall" refers to a surface that is isothermal or hotter than molten silicon. Preferably, a hot-wall surface remains fixed during processing of the silicon.

Consistent with embodiments of the invention, the crystallized silicon can be either continuous monocrystalline, or continuous multi-crystalline having controlled grain orientations. As used herein, the term "continuous monocrystalline silicon" refers to single crystal silicon, where the body of silicon is one homogeneous body of monocrystalline silicon and not smaller pieces of silicon joined together to form a larger piece of silicon. Further, as used herein, the term "continuous multi-crystalline silicon" refers to multi-crystalline silicon where the body of silicon is one homogeneous body of multi-crystalline silicon and not smaller pieces of silicon joined together to form a larger piece of silicon.

Casting of silicon, according to embodiments of the present invention, can be accomplished by positioning a desired collection of crystalline silicon "seeds" in, for example, the bottom of a vessel, such as a quartz crucible that can hold molten silicon. The seeds may cover all, or most, or substantially all, of the bottom of the crucible. As used herein, the term "seed" refers to a geometrically shaped piece of silicon with a desired crystal structure, having a side that conforms to a surface of a vessel in which it may be placed. Such a seed can be either a monocrystalline piece of silicon or a piece of geometrically ordered multi-crystalline silicon. Consistent with the present invention, a seed may have a top surface that is parallel to its bottom surface, although this does not have to be the case. For example, a seed can be a piece of silicon, varying in size from about 2 mm to about 10 mm across, to about 100 mm to about 1000 mm across. The piece of silicon may have a thickness of about 1 mm to about 1000 mm, preferably about 10 mm to about 50 mm. A suitable size and shape of the seed may be selected for convenience and tiling. Tiling, which will be described in more detail below, is where silicon seed crystals are arranged in a predetermined geometric orientation or pattern across either the bottom or the sides and bottom surfaces of a crucible.

Silicon feedstock may then be introduced into the crucible over the seeds, and then the feedstock is melted. Alternatively, molten silicon may be poured directly into the crucible and over the seeds. When molten silicon is poured, the crucible is preferably first brought very close to or up to the melting temperature of silicon, and then the molten silicon is poured in. Consistent with embodiments of the invention, a thin layer of the seeds can be melted before solidification begins.

The molten silicon is then allowed to cool and crystallize in the presence of the seeds, preferably in a manner such that the cooling of the molten silicon is conducted so that the crystallization of the molten silicon starts at or below the level of the original top of the solid seeds and proceeds away, preferably upwards away, from the seeds. This can be accomplished by extracting the heat of fusion through the seed crystals to a heat sink. As used herein, the term "heat sink" refers to a body of material used to extract heat from another body of material. A heat sink may extract heat by means of conduction of heat from a higher temperature area to a lower temperature area, by convection with a lower temperature fluid or by direct radiation of energy to a lower temperature object. A thermal gradient is generally maintained across a heat sink such that one side is in equilibrium with the object to be cooled while the other exchanges energy with a cooler area.

The first temperature, such as a range of between about 1410° C. and about 1300° C. usually includes a temperature gradient across and/or through the solid body. The second temperature, such as a range of between about 1250 and 1380° C. on average usually includes a reduced temperature gradient and/or a uniform temperature profile across and/or through the solid body. Alternately, the first temperature includes a range of between about 1410° C. to about 1450° C. and the second temperature includes a range of between about 1200° C. and about 1400° C. The step of reducing the temperature gradient may be referred to sometimes as annealing in the context of this disclosure. Annealing may include closing up the insulation, for example.

According to embodiments of the invention, the liquid-solid interface between the molten silicon and the crystallized silicon, during melting or solidification, need not be maintained substantially flat throughout the casting process. That is, the solid-liquid interface at an edge of the molten silicon is controlled during the cooling so as to move in a direction that increases a distance between the molten silicon and the silicon seed crystal. As the solidification of the molten silicon starts, the solidification front is initially substantially flat, preferably with a strong curvature at the horizontal edges of the growing solid mass of silicon. The shape of the solid-liquid interface thus may have a controlled profile throughout the casting process.

By conducting the crystallization of the molten silicon in a manner consistent with embodiments of the invention, cast silicon having specific, rather than random, grain boundaries and specific grain sizes can be made. Additionally, by aligning the seeds in a manner such that all seeds are oriented the same relative direction to each other, for example the (100) pole direction being perpendicular to a bottom of the crucible and the (110) pole direction at 45° to the sides of a rectangular or square cross-section crucible, large bodies of cast silicon can be obtained that are, or are essentially, monocrystalline silicon in which the pole direction of such cast silicon is the same as that of the seeds. Similarly, other pole directions may be perpendicular to the bottom of the crucible. Moreover, one or more seeds may be arranged so that any common pole direction is perpendicular to a bottom of the crucible. Furthermore, consistent with an embodiment of the invention, seed crystals of two or more different pole directions can be used together to maximize the effectiveness of the crystal growth, creating a volume of silicon as large as possible with the desired crystal orientation.

The seeds used for casting processes, consistent with embodiments of the invention, can be of any desired size and shape, but are suitably geometrically shaped pieces of monocrystalline, or geometrically ordered multi-crystalline, silicon, such as square, rectangular, hexagonal, rhomboid or octagonal shaped pieces of silicon. They can be shaped conducive to tiling, so they can be placed or "tiled" edge-to-edge and conformed to the bottom of a crucible in a desired pattern. Also consistent with embodiments of the invention, seeds can be placed on one or more sides of the crucible. Such seeds can be obtained, for example, by sawing a source of crystalline silicon, such as a boule of monocrystalline silicon, into pieces having the desired shapes. The seeds can also be formed by cutting them from a sample of silicon made by a process according to the embodiments of the invention, such that seeds for use in subsequent casting processes can be made from an initial casting process. For example, a smaller piece of dislocation-free seed material can used to grow a large dislocation free single crystal, sufficient to cover the entire bottom of the crucible for use as a new seed crystal layer.

Processes and apparatuses for preparing silicon in accordance with embodiments of the invention will now be described. However, it is to be understood that these are not the only ways to form silicon consistent with the embodiments of the invention.

Figure 1B:
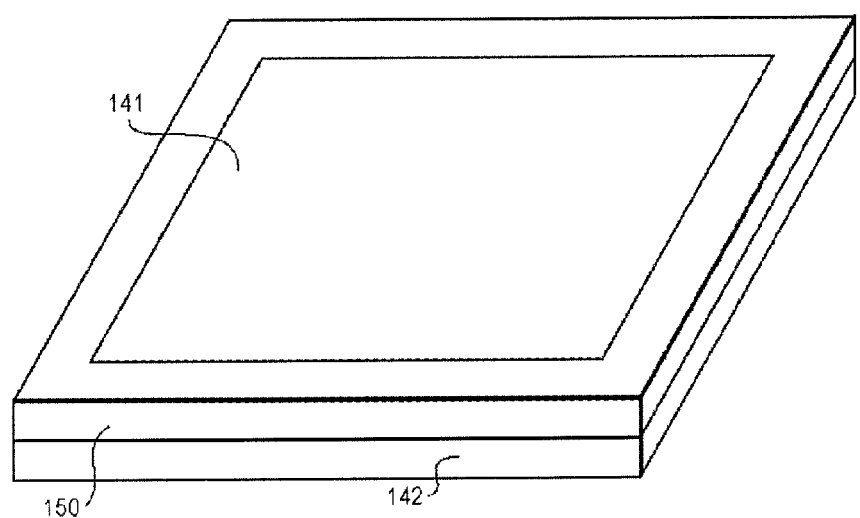

Referring to FIGS. 1A and 1B, the cross-section of a casting station hot zone is depicted in FIG. 1A, showing liquid silicon 100 and solid silicon 101 at the end of the melting stage of a seeded casting process. The silicon is positioned in a bottomed and walled crucible 110, which may be, for example, a fused quartz or silica crucible. At this point, solid silicon 101 in crucible 110 is entirely constituted from a seed layer of silicon previously loaded at the bottom of the crucible. Feedstock silicon (not shown) is introduced on top of the seed layer. Feedstock silicon can either be loaded as a solid and then melted in the crucible, or melted in a separate container and introduced as a liquid on top of the seeds. In either case, the original silicon seed layer is partially melted and solid silicon 101 is entirely composed of the remainder of the silicon seed layer. Preferably, crucible 110 has a release coating such as one made from silica, silicon nitride, or a liquid encapsulant, to aid in the removal of crystallized silicon from crucible 110.

Still referring to FIG. 1A, in this depiction of a furnace hot zone, resistive heaters 120 provide the energy to maintain the temperature required to melt silicon, while insulation 130 prevents the escape of heat to an outer chamber (not shown). Consistent with an embodiment of the invention, crucible 110 is supported by a number of layers which also serve to conduct heat away from the silicon in a controlled way. For example, a heat conducting block 140 radiates heat to a water cooled chamber (not shown), thereby cooling the hot-zone components above it. A graphite support plate 142, shown in cross section in FIG. 1A and in three dimensions in FIG. 1B, conducts heat from heat conducting layer 141, which in turn conducts heat away from crucible 110 and silicon 100 and 101. A thermally insulating layer 150 may surround heat conducting layer 141, in an exemplary configuration, in order to alter the heat removal path and consequently alter the shape of the solidification front. Solid graphite side plates 143 surround crucible 110 and provide structural support to the crucible. Consistent with embodiments of the invention, the casting station may have a graphite support plate 142, though a tailored heat conduction path controlled by conducting layer 141 and thermally insulating layer 150 is not required.

Still referring to FIGS. 1A and 1B, graphite side plates 143 may rest on graphite support plate 142, and conduct heat directly to plate 142, which may create cold spots at the bottom edges of the crucible. The effect of the tailored heat conduction, vis-à-vis layers 141 and 150, however, can alter the cooling parameters, and, hence, the shape of the liquid/solid interface by, for example, keeping the corners of crucible 110 hotter, resulting in only a small amount of lateral melting. For example, as shown in FIG. 1A, solid silicon 101 has a high curvature at its left and right edges due to the heat exchange occurring in materials below crucible 110. Such a curvature can result in the lateral expansion of the solid and outward growth of a seeded crystal structure. In FIG. 1A, crystal growth directions of solid silicon 101 are indicated by black arrows.

Figure 2A:
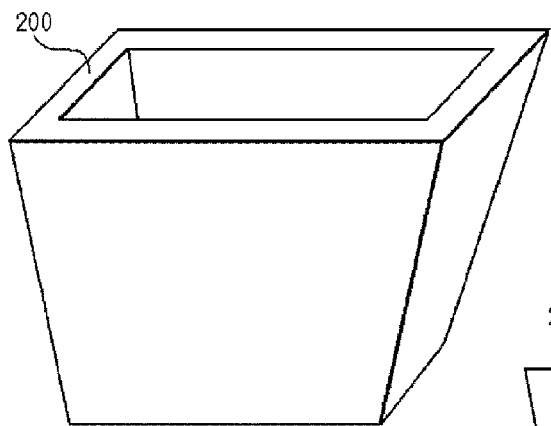
FIGS. 2A-2D illustrate two examples of tapered crucibles together with illustrations of the desired effects on the silicon cast therein, according to embodiments of the present invention.
Figure 2B:
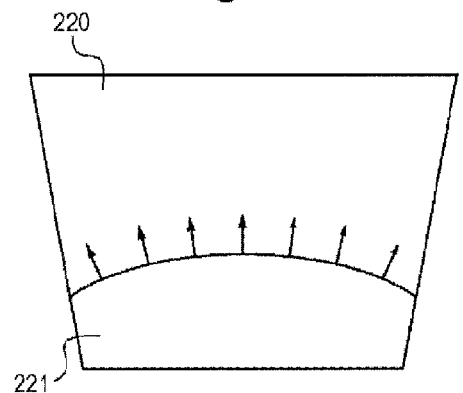
Figure 2C:
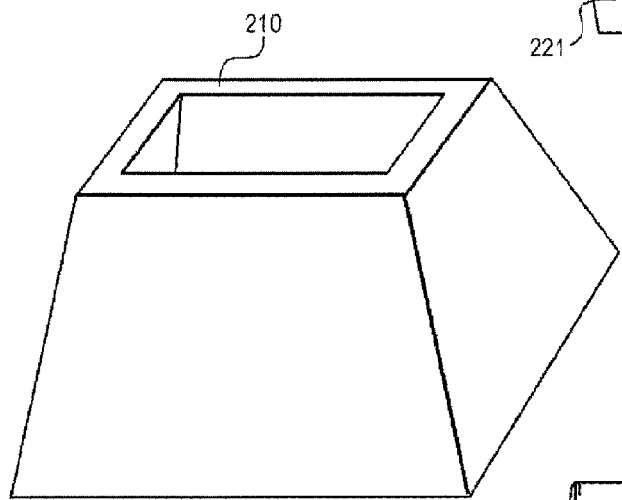
Figure 2D:
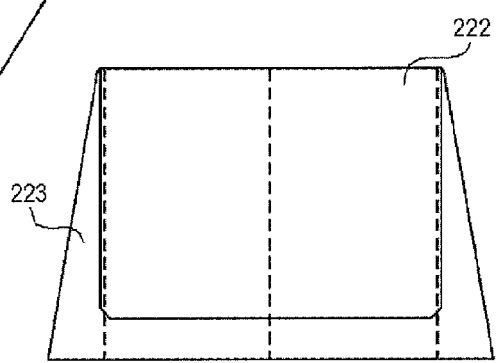

Referring to FIGS. 2A-2D, crystal growth of silicon may be altered by altering the shape of the crucible. For example, crystal growth can be accomplished in an outwardly tapered crucible 200, as shown in FIGS. 2A and 2B, where the curvature of liquid silicon 220 to the solid silicon 221 promotes lateral expansion of the seeded crystal (not shown), whose growth direction is indicated by arrows in FIG. 2B. In another example, crystal growth can be accomplished in an inwardly tapered crucible 210, as shown in FIGS. 2C and 2D, which, like crucible 200 in FIG. 2A, also has the advantage of maximizing the amount of usable cast silicon 222, and minimizing the amount of unusable or undesirable silicon 223 to be removed during cutting of the cast silicon ingot (222+223) into bricks (shown by dashed lines). The tapered shape of undesirable silicon 223 on a side wall of the cast silicon (viewed in cross-section in FIG. 2D) is due to the extra time that the silicon at the bottom of the crucible spends at a high temperature state during solidification and crystal growth compared with the silicon at the top of the ingot, which is cooled more quickly.

Figure 3:
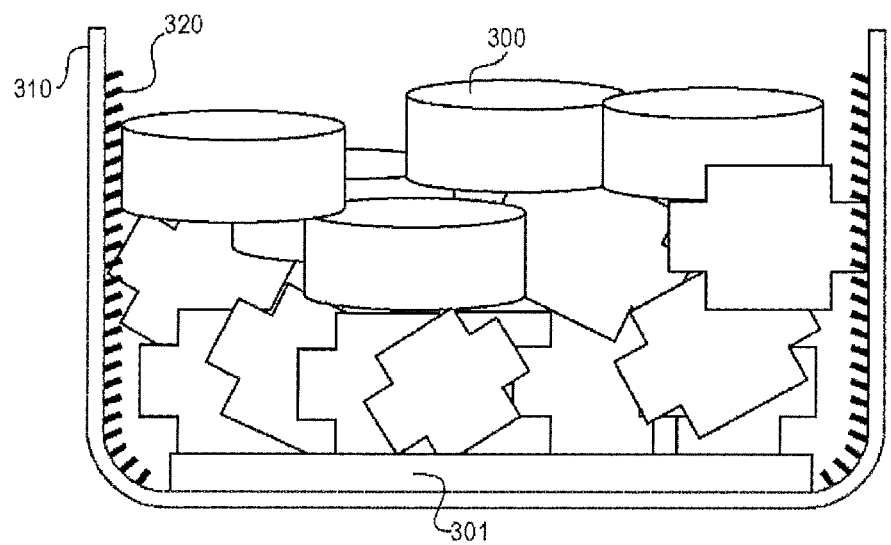
FIG. 3 illustrates an example of silicon feedstock loaded into a partially coated crucible, according to an embodiment of the present invention.

FIG. 3 illustrates a cross-section of silicon (feedstock 300 and crystalline seeds 301) loaded into crucible 310 for casting. Release coating 320, such as silicon nitride or silicon carbide, may be applied to areas of crucible 310 where feedstock 300 contacts crucible 310, which corresponds to areas of silicon 300 that will become completely melted during casting. No coating has been applied below crystalline seeds 301. Seeds 301 will not be completely melted and thus will not adhere to crucible 110.

Figure 4:
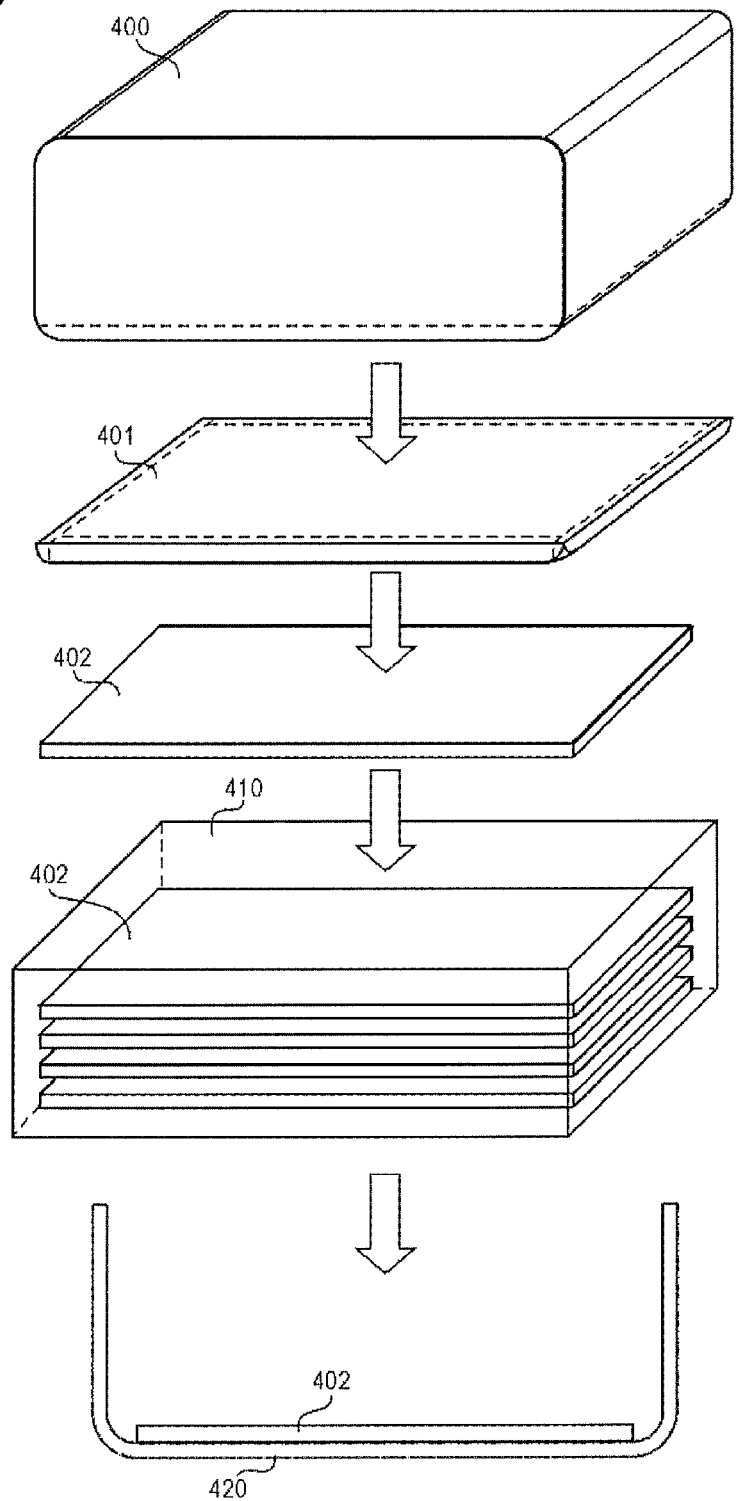
FIG. 4 illustrates an example of a method for recycling seed layer material, according to an embodiment of the present invention.

FIG. 4 illustrates a process for the reuse of a crystalline silicon seed layer. As shown in FIG. 4, cast ingot 400 grown from seed layer 401 is first sliced along the dotted lines to remove a slab of material containing seed layer 401. The slab of material is then trimmed at the dotted edges to remove excess material that might interfere with its placement in another crucible. Trimmed slab 402, having been trimmed to the size and shape of original seed layer 401, is then treated, potentially with other similar pieces of silicon, in a container 410, such as a tank or a tub containing a suitable liquid or other material, to remove contaminants and debris from layer 401 (and possibly other pieces of silicon) before being placed in a new crucible 420 for use as a seed layer in a subsequent casting process.

Figure 5:
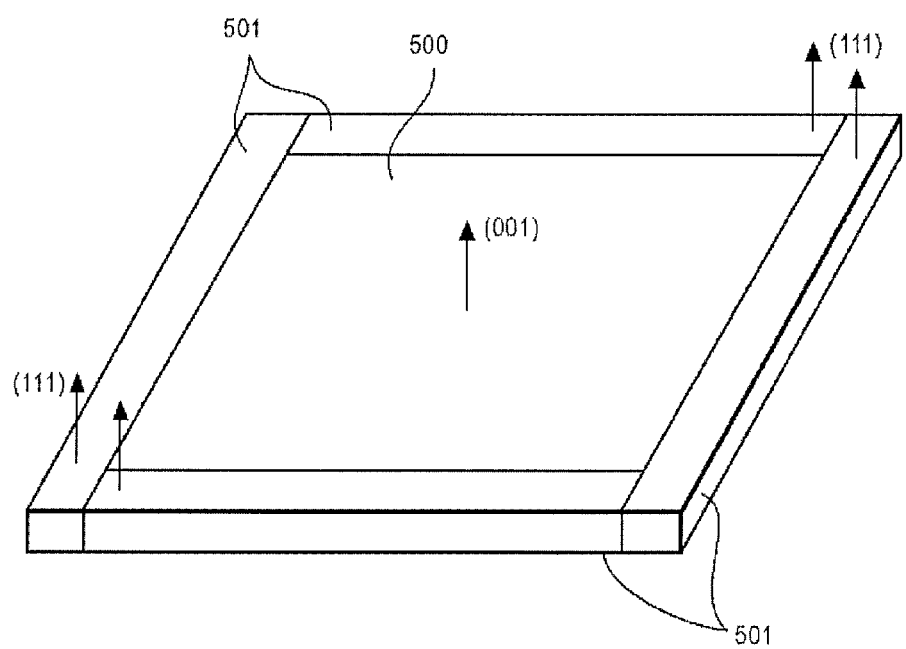
FIG. 5 illustrates an exemplary arrangement of single crystal silicon to form a seed layer, according to an embodiment of the present invention.

FIG. 5 illustrates an exemplary arrangement of single crystal silicon pieces arranged to form a seed layer. The (001) crystal orientation has been shown to have advantageous properties for the manufacture of silicon solar cells. (001) silicon may be chemically etched in such a way as to produce a pattern pyramids covering its entire surface, which can improve the light-trapping ability of the silicon by both decreasing reflection and increasing the path length of light in the material. Chemical etching may be accomplished by known methods. However, the casting of (001) silicon is made difficult by its tendency to grow grain boundaries at acute angles to its (001) pole direction when located next to a multicrystalline region of silicon. To counteract the growth of multicrystalline silicon, a geometric arrangement of a plurality of monocrystalline silicon seed crystals can be placed on at least one surface in a crucible (not shown), e.g., a bottom surface of a crucible, wherein the geometric arrangement includes close-packed polygons. As shown in FIG. 5, a piece of (001) silicon 500 is surrounded by a periphery of rectangles of (111) silicon 501. The pole orientation of the peripheral silicon 501 is shown as (111), but it could be any crystal orientation that is competitively favored when grown next to a multicrystalline region. In this way, the majority of a resulting cast ingot (not shown) will be composed of (001) silicon, and the competitively favored (111) grains grown from silicon 501 will limit the growth of multicrystalline silicon in the region occupied by (001) silicon over silicon 500. Similarly, silicon crystal grains produced by casting a body of multicrystalline silicon, consistent with embodiments of the invention, may be grown in a columnar manner. Further, such crystal grains may have a cross section that is, or is close to, the shape of the seed from which it is formed, instead of having an (001) cross-sectional area that shrinks as solidification proceeds. When making silicon that has such specifically selected grain boundaries, preferably the grain boundary junctions only have three grain boundaries meeting at a corner, a condition met in the arrangement shown in FIG. 5.

FIG. 6 illustrates a process for manufacturing large area, dislocation-free single crystals for use as seed layers. In this process, depicted in cross-section, polycrystalline feedstock 600 is loaded together with a single crystal seed 601 which may have lateral dimensions from about 25 cm² to about 10,000 cm² in area and a thickness from about 3 mm to about 1000 mm. Feedstock 600 is placed in crucible 610, which is then placed in a station (not shown) on top of layers 620, 621, and 630, composed of thermally conducting (620) and thermally insulating (630) parts. The area of the thermally conducting parts 620 should preferably be about the same shape of bottom of crucible 610, having a lateral area from about 50% to about 150% that of seed crystal 601. During melting, heat is extracted through thermally conducting area 620 to a support plate 621, while heat is prevented from passing through thermally insulating layer 630. Heat is conducted out through thermally conducting area 620 even during the melting phase of casting, in order to prevent the complete melting of seed crystal 601. Once all feedstock 600 and a small portion of seed crystal 601 are melted into liquid silicon 602, remaining solid silicon 603 then acts as the nucleation layer for the solidification process. The presence of insulating layer 630 helps control the shape of solid silicon 603 during nucleation and growth, as well as the direction of solidification, indicated by arrows in FIG. 6. The strong curvature in the solidification surface causes an outward growth of solid silicon 603, while multicrystalline regions 605 are minimized. Once ingot 604 is cast, horizontal layers may be cut (dashed lines) from the upper parts of the ingot to be used as new seed slabs 606. Slabs 606 can be cleaned, trimmed, and used as a complete seed layer for a new ingot in a new crucible 610, or as a starting point for an even larger single crystal, again using the process just described.

Figure 7A:
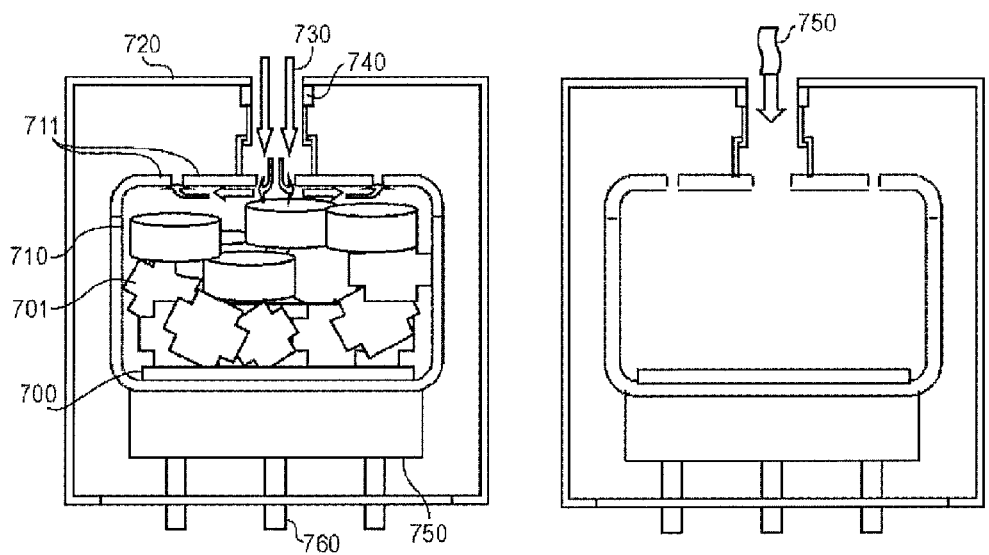
FIGS. 7A-7B illustrate an exemplary apparatus for casting low carbon monocrystalline or multicrystalline silicon, according to an embodiment of the present invention.
Figure 7B:
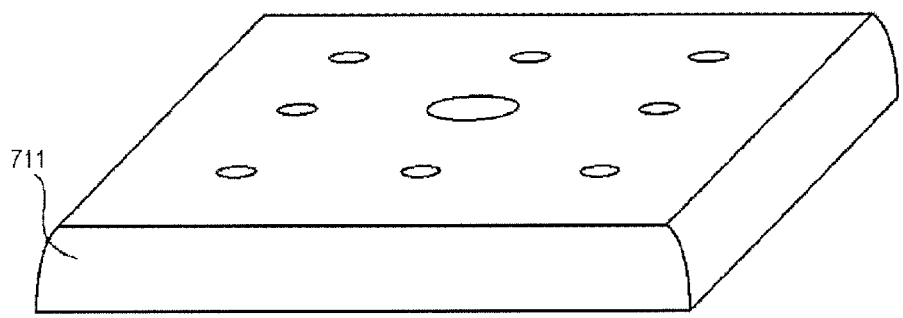

FIGS. 7A and 7B are depictions of the cross-section of an apparatus for the casting of low carbon monocrystalline or multicrystalline silicon in a seeded ingot. As shown in FIG. 7A, seed crystal 700 is loaded together with feedstock 701 in crucible 710 located in a furnace hot zone (unlabeled). Crucible 710, though illustrated as covered with ceramic lid 711 (also shown in FIG. 7B), may be uncovered and completely open to the surrounding atmosphere. In casting, carbon can be incorporated into an ingot from detached pieces of graphite insulation 720 which may fall into crucible 710, or by a gas phase reaction where oxygen from crucible 710 dissolves into the silicon melt and then evaporates as SiO molecules (not shown). These molecules can adhere to graphite parts 720, 750, 760 of the furnace and react via the reaction $SiO + 2C \rightarrow SiC + CO$.

The CO gas molecule enters the liquid where SiC forms and O is again liberated to repeat the cycle. By introducing ceramic lid 711 (shown in FIG. 7B) to crucible 710, and carefully controlling process gas 730 (which may be, for example, argon), both mechanisms of carbon incorporation can be effectively stopped, or severely restricted. Ceramic lid 711 can be made of a number of materials including, for example, fused silica, quartz, silicon carbide, silicon nitride, and the like. It is desirable for the design that a fresh supply of an inert gas, such as argon, come in through channel 740 and exit through another channel (not shown) in order to prevent the above-described carbon gas reaction.

Still referring to FIGS. 7A and 7B, the casting process can be operated either by loading one or more seeds 700 and feedstock 701 prior to installing crucible 710 in the furnace, or by loading only one or more seeds 700 and later introducing liquid silicon 770 into the crucible from a separate melt chamber.

Figure 8:
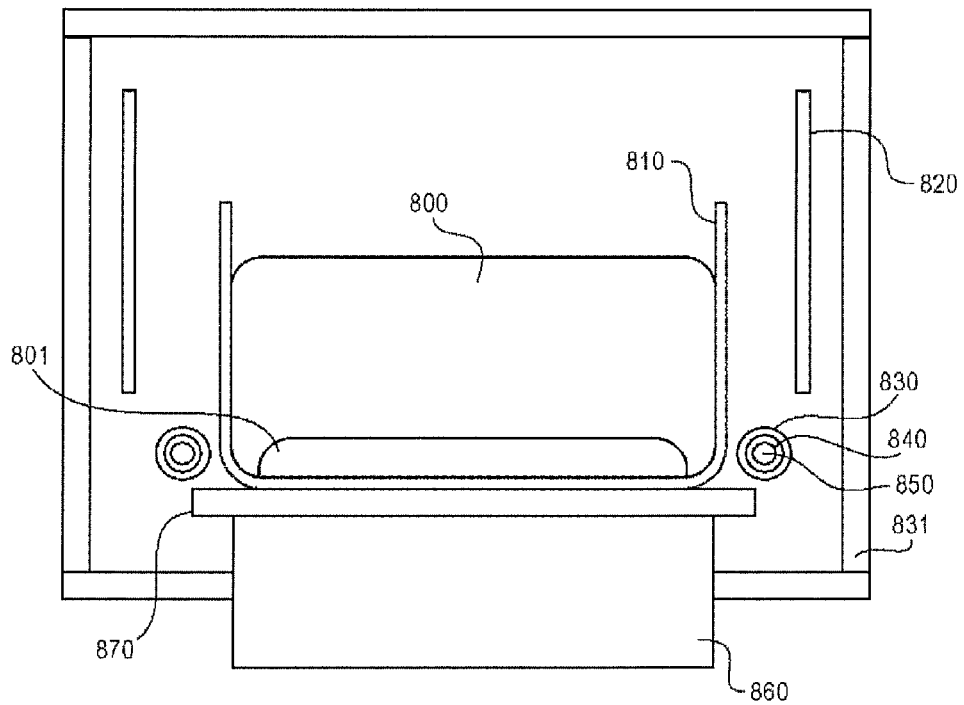
FIG. 8 illustrates an exemplary apparatus for casting monocrystalline or multi-crystalline silicon, according to embodiments of the present invention.

FIG. 8 illustrates an apparatus consistent with embodiments of this invention for modifying the shape of the solid-liquid interface during casting. As shown in FIG. 8, primary heaters 820 and an additional heater 840 are placed in the hot zone (shown surrounded by insulation 831) of a casting station to introduce targeted heating to material 800, 801. Liquid material 800 on top of solid seed material 801 has an interface that is curved at the edges, near the side walls of crucible 810. Primary heaters 820 together with primary heat sink 860 normally work to produce a substantially flat solid-liquid interface (not shown). However, additional heater 840 couples an electric current directly to material 800, 801, introducing inductive heating to the edges of the material 800, 801 near the walls of crucible 810, and thereby melts solid material 801 in its vicinity.

Additional heater 840, as shown in FIG. 8, is a coil of conductive metal, which may be, for example, copper, that is cooled with circulating liquid 850 and thermally insulated from primary heaters 820 by surrounding layer 830. Additional heater 840 may be a single turn coil surrounding crucible 810 in a loop, as illustrated in FIG. 8, or it may have multiple loops forming a helix having any desired spacing between loops constituting the helix. Additional heater 840 may also be configured so that it can move relative to the walls of crucible 810 in order to affect the solid-liquid interface (not shown). Additional heater 840 operates by electrical current flowing through the copper pipe while the water cools it so the current through the pipe forms a strong magnetic field which couples with the liquid silicon, inducing a corresponding current in the silicon. Resistive heat from the current in and/or through the silicon provides the heating action in a localized way and/or manner.

Alternately, resistive heaters could be used as additional heaters 840, but resistive heaters may not be as efficient in targeting the heat application to a specific volume of material, such as material 800, 801. During casting with the apparatus shown in FIG. 8, additional heater 840 would only be activated near the end of the melting cycle, so as not to overly melt seed material 801. Additional heater 840 would continue to apply heat to crucible 810 through at least about the first 20% of the solidification process. Additional heater 840 may also continue to apply heat to crucible 810 through the entire solidification process until implementation of the cooling stage.

Figure 9:
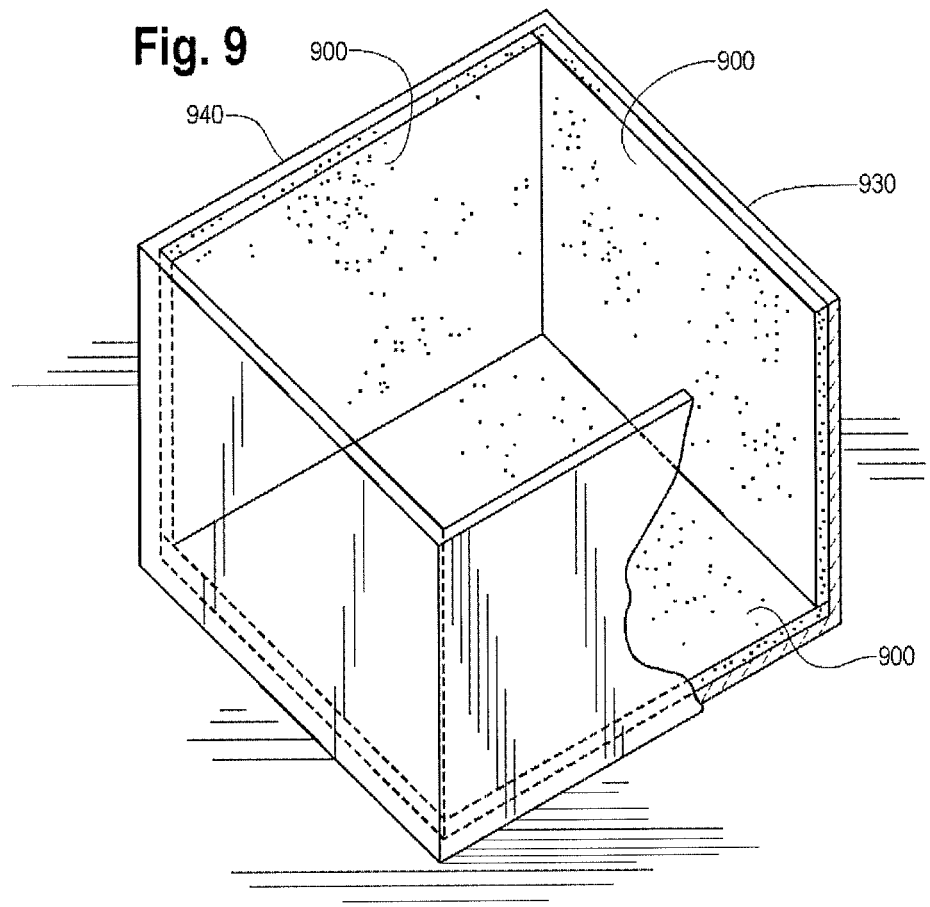
FIG. 9 illustrates an exemplary apparatus for casting monocrystalline or multi-crystalline silicon, according to embodiments of the present invention.

As shown in FIG. 9 and according to one embodiment, the volume of monocrystalline and/or bi-crystalline silicon may be further increased by the use of side seed plates and/or slabs. Seeds 900 can also be placed on one or more side walls 930, 940 of crucible 910. Seeds 900 can be placed on all four walls of crucible 910, although for illustration purposes only, seeds 900 are shown only on walls 930, 940. Preferably, the seeds 900 that are placed on any of the four walls of crucible 910 are columnar and/or monolithic to facilitate crystal growth. Preferably, each of the columnar seeds placed on any of the four walls of crucible 910 will have the same grain orientation as the seed placed immediately below it on the bottom surface of crucible 910. In the case of geometric multi-crystalline silicon growth, placing the columnar seeds in this manner will facilitate the growth of geometric multicrystalline silicon grains as large as the height of the crucible 910. Alternately, monocrystalline slabs are used on the sides and resulting in increased monocrystalline material.

Still referring to FIG. 9, advantages of this arrangement of seeds 900 are a quicker, more simple, self-propagating process for casting silicon with higher crystallinity and higher growth rates. For example, silicon maybe melted in a silicon 'cup', consisting of many seeds that are stacked together to form a cavity, e.g., a bottom and four walls, inside crucible 910. Alternatively, molten silicon may be poured in a silicon 'cup', consisting of many seeds that are stacked together to form a cavity, e.g., a bottom and four walls, inside crucible 910. In an alternative example, the receiving 'cup' is first brought up to the melting temperature of silicon, but maintained in solid state, and then the molten silicon is poured in and allowed to come to thermal equilibrium. Then, in either example above, crucible 910 is cooled, whereby heat is removed from the bottom and sides of crucible 910 by, for example, a solid heat sink material (not shown) which radiates heat to the ambient, while heat is still applied to the open top of crucible 910. In this way, the resulting cast ingot of silicon may be either monocrystalline or geometric multi-crystalline (depending on the type of seeds 900 used and their orientation), and the crystallization proceeds faster than own multi-crystalline casting processes. To repeat this process, a portion of the sides and bottom of the crystallized silicon ingot are removed, using known techniques, and can be reused in a subsequent casting process. Preferably, a plurality of seed crystals, e.g., seeds 900, are arranged so that a common pole direction among seeds 900 is perpendicular to each of the bottom and a side of crucible 910, so that no grain boundaries are formed between the bottom and a side of crucible 910.

Figure 11:
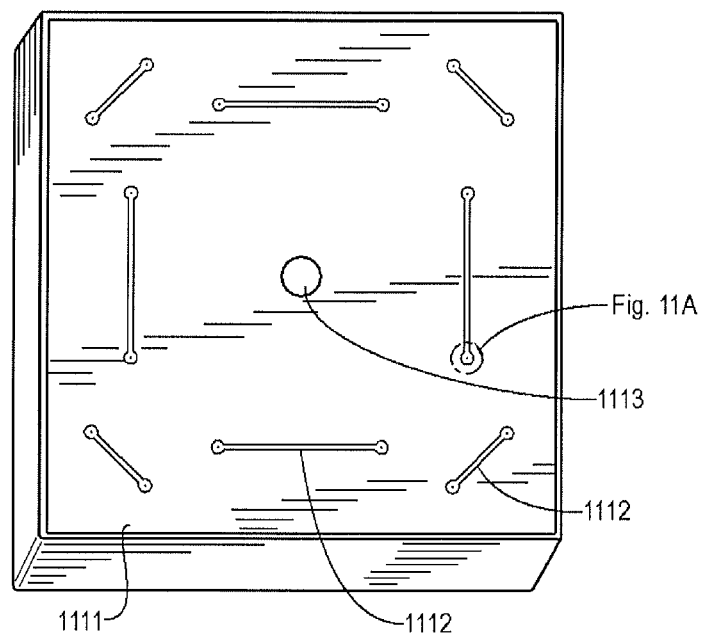
FIGS. 11, 11A and 11B illustrate an exemplary lid for casting silicon monocrystalline or multi-crystalline silicon, according to embodiments of the present invention.
Figure 11A:
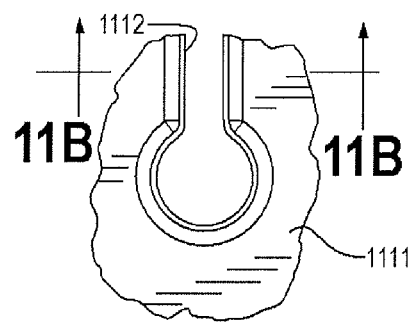
Figure 11B:
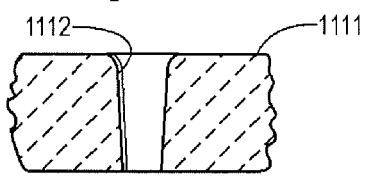

According to one embodiment and as shown in FIGS. 11, 11A and 11B, a lid 1111 for casting silicon includes a plurality of shaped holes 1112 disposed with respect to a central injection hole 1113. Desirably, but not necessarily, the shaped holes 1112 include a generally slot portion in a center with a generally circular portion located at and/or near an end of the slot portion. The configuration of shaped hole 1112 may sometimes be referred to as a "dog bone" and/or a "dumbbell". The slot and/or the circle can be of any suitable size and/or location. Desirably, one shaped hole 1112 corresponds to each side of the lid 1111 and each corner of the lid 1111, such as eight shaped holes 1112 total. The corner shaped holes may be shorter than the side shaped holes, such as about half a length. Desirably, the shaped holes 1112 are tapered, such as narrower at the inside of the lid 1111 and wider at the outside of the lid 1111. The shaped holes may reduce back mixing and/or entrainment of debris and/or contaminants into the silicon.

As disclosed herein, embodiments of the invention can be used to produce large bodies of monocrystalline silicon, near-monocrystalline silicon, bi-crystal silicon, or geometric multi-crystalline silicon, by a simple and cost-effective casting process. The silicon feedstock used in processes consistent with embodiments of the invention, and thus the silicon produced, can contain one or more dopants selected from a list including: boron, aluminum, lithium, gallium, phosphorus, antimony, arsenic, and bismuth. The total amount of such dopant or dopants can be about 0.01 parts per million (ppm) by atomic % (ppma) to about 2 ppma. Preferably, the amount of dopant or dopants in the silicon is an amount such that a wafer made from the silicon has a resistivity of about 0.1 to about 50 ohm-cm, preferably of about 0.5 to about 5.0 ohm-cm. Alternately, other materials having a suitable liquid phase can be cast using the processes and apparatuses disclosed here. For example, germanium, gallium arsenide, silicon germanium, sapphire, and a number of other III-V or II-VI materials, as well as metals and alloys, could be cast according to embodiments of the present invention.

Moreover, although casting of silicon has been described herein, other semiconductor materials and nonmetallic crystalline materials may be cast without departing from the scope and spirit of the invention. For example, the inventors have contemplated casting of other materials consistent with embodiments of the invention, such as germanium, gallium arsenide, silicon germanium, aluminum oxide (including its single crystal form of sapphire), gallium nitride, zinc oxide, zinc sulfide, gallium indium arsenide, indium antimonide, germanium, yttrium barium oxides, lanthanide oxides, magnesium oxide, calcium oxide, and other semiconductors, oxides, and intermetallics with a liquid phase. In addition, a number of other group III-V or group II-VI materials, as well as metals and alloys, could be cast according to embodiments of the present invention.

In some embodiments, a method of manufacturing cast silicon may include loading a seed layer of crystalline silicon into a crucible, such as on a bottom surface of the crucible. The method may include loading solid silicon feedstock into the crucible, such as on top of the seed layer. The method may include placing a lid over an opening of the crucible, such as a mouth of a vessel. The method may include flowing an inert gas into the crucible through at least one hole in the lid, such as a central port and where the inert gas may be argon and/or nitrogen. Any other gas inert with respect to silicon may be used, such as helium, xenon and/or any other suitable vapor.

The method may further include expelling the inert gas from the crucible through at least one other hole in the lid, for example a plurality of radially disposed apertures. Desirably, the expelling prevents backflow, entrainment and/or back-mixing into the crucible. The method may include melting the silicon feedstock while maintaining a part of the seed layer in a solid state and forming a solid body of silicon. The method may also include cooling the solid body. Desirably, the method includes forming a solid body by extracting heat through at least a bottom surface of the crucible.

In some embodiments, the flowing of the inert gas occurs during at least the melting of the silicon feedstock and the forming of a solid body. Alternately, the inert gas is applied at all times except initial dry out and/or off-gassing. Desirably, the flowing of the inert gas pressurizes the crucible above a surrounding environment, such as at a couple millimeters of water pressure. The method may further include applying a vacuum to the crucible after loading the seed layer and the silicon feedstock, and before flowing of the inert gas begins, such as to remove and/or reduce water vapor.

In some embodiments, the flowing and the expelling of the inert gas at least partially reduces or prevents carbon incorporation into the cast silicon, such as from carbon dust falling into the silicon from the graphite insulation. The flowing and the expelling of the inert gas may at least partially reduce SiO in the crucible, such as from the molten silicon.

In some embodiments, the solid body comprises low carbon silicon, such as a carbon concentration of about $1 \times 10^{16}$ to about $4 \times 10^{17}$, and/or about the solvency limit. As discussed above generally a lower carbon concentration is desired for solar applications. The low carbon concentrations of the silicon according to this invention are in contrast to the higher carbon concentrations of other cast silicon methods and also CZ silicon.

In some embodiments, the invention includes a body of cast silicon comprising an average carbon concentration below the solubility limit of about $4*10^{17}$ atoms/cm$^3$ and an average oxygen concentration below about $8*10^{17}$ atoms/cm$^3$. Oxygen concentrations may range between about $1.2*10^{18}$ and about $1*10^{17}$, for example.

Alternately, a method of manufacturing cast silicon includes: optionally loading a seed layer of crystalline silicon into a crucible; optionally covering the crucible with a lid; introducing liquid silicon into the crucible; melting a part of the seed layer if present; forming a solid body of silicon; optionally flowing an inert gas into the crucible; optionally expelling the inert gas from the crucible; and cooling the solid body. The inert gas may enter or be supplied to one or more holes and/or apertures in and/or through the lid and/or the crucible. The inert gas may exit and/or exhaust from one or more holes and/or apertures in and/or through the lid and/or the crucible. Desirably, but not necessarily, the supply port and the exhaust port are different orifices. Alternately, a single penetration operates as both the supply and exhaust, such as with a concentric arrangement and/or configuration.

The order of steps presented in this and all methods disclosed herein should not be taken as limited to the listed sequence and/or number of steps, unless explicitly stated.

The liquid silicon may include superheated liquid silicon, such as having an amount of superheating to melt a thin layer of the seed crystal upon introduction of the superheated liquid to the crucible. Alternately, the amount of superheating includes between about 1° C. and about 100° C. above the temperature of molten silicon. Other ranges of superheating are possible.

In some embodiments, a method of manufacturing cast silicon includes: loading a bottom seed layer of crystalline silicon on a bottom of a crucible; loading at least one side plate seed layer of crystalline silicon next to at least one side wall of the crucible; covering the crucible with a lid; introducing liquid silicon into the crucible; melting a part of the bottom seed layer or the at least one side plate seed layer; forming a solid body of silicon; flowing an inert gas through at least one hole in the lid; expelling the inert gas through at least one other hole; and cooling the solid body. The side seed plates and/or crystals desirably have an orientation corresponding to the seed layers on a bottom surface of the crucible. The side seed plates may be temporarily affixed to the side walls and/or may join with and/or combine with the bottom seed layer, for example.

U.S. Patent Application Publication No. 20070169684A1, titled "Methods and Apparatuses for Manufacturing Monocrystalline Cast Silicon and Monocrystalline Cast Silicon Bodies for Photovoltaics" discloses the use of side seed plates. U.S. Patent Application Publication No. 20070169685A1, titled "Methods and Apparatuses for Manufacturing Geometric Multicrystalline Cast Silicon and Geometric Multicrystalline Cast Silicon Bodies for Photovoltaics" also discloses the use of side seed plates. The entire contents of commonly assigned Application Publication Nos. 2007/0169684 and 2007/0169685 are hereby incorporated by reference in their entirety.

In some embodiments, the forming a solid body includes extracting heat through a bottom surface of the crucible. Alternately, the forming a solid body may include extracting heat through a bottom surface and at least one side wall of the crucible. Alternately, heat may be extracted through the top surface and/or lid. Suitable cooling may include convection, conduction, and/or radiation mechanisms.

In some embodiments, a method of manufacturing cast silicon includes: optionally loading a seed layer of crystalline silicon together with solid silicon feedstock into a crucible having a lid; and melting the silicon feedstock and forming a solid body of silicon while maintaining a part of the seed layer in a solid state when present and while flowing an inert gas through at least one hole in the lid or the cover while expelling the inert gas through at least one other hole in the lid or the cover; and cooling the solid body.

In some embodiments, a method of manufacturing cast silicon includes: loading a seed layer of crystalline silicon into a crucible; covering the crucible with a lid; introducing liquid silicon into the crucible; allowing part of the seed layer to melt; forming a solid body of silicon while flowing an inert gas through at least one hole in the lid while at least one other hole expels the inert gas; and cooling the solid body.

In some embodiments, a method of manufacturing cast silicon includes: loading a seed layer of crystalline silicon into a crucible; covering the crucible with a lid; introducing superheated liquid silicon into the crucible; melting a part of the seed layer; forming a solid body of silicon; and cooling the solid body. The method may also include an amount of superheating sufficient to melt a thin layer of the seed crystal upon introduction of the superheated liquid to the crucible. Alternately, the crucible may be heated at and/or above the melting point of the silicon prior to introduction of the seed material followed by rapid introduction of the liquid and/or molten silicon. The superheating may include any suitable amount, such as between about 1° C. and about 100° C. above the melting point of silicon.

According to some embodiments, a method of manufacturing cast silicon includes: introducing liquid silicon into the crucible and/or placing solid silicon feedstock into the crucible and melting the silicon feedstock; forming a solid body of silicon; flowing an inert gas into the crucible; expelling the inert gas from the crucible; and cooling the solid body. The method may further include covering the crucible and/or at least a portion of the crucible or an opening of the crucible with a lid. The flowing the inert gas may include passing the inert gas through one or more holes in the lid or the crucible. The expelling the inert gas may include passing the inert gas through one or more holes in the lid or the crucible. The holes for flowing and/or expelling the inert gas may include any suitable shape, such as round, square, rectangular, triangular, slot, shaped holes, and/or the like. The flowing and the expelling of the inert gas may occur through the same and/or different holes.

The following examples are experimental results consistent with embodiments of the invention. These examples are presented for merely exemplifying and illustrating embodiments of the invention and should not be construed as limiting the scope of the invention in any manner.

EXAMPLE 1

Crucible preparation: A crucible was placed on a supporting structure consisting of two layers. The bottom layer of the supporting structure is a solid isomolded graphite plate measuring 80 cm by 80 cm by 2.5 cm which supported a composite layer. The upper composite layer had an inner region that was a thermally conducting isomolded graphite plate measuring 60 cm by 60 cm by 1.2 cm, and was surrounded on all sides by a 10 cm perimeter of thermally insulating graphite fiber board of 1.2 cm thickness. In this way, the composite layer completely covered the bottom layer.

Seed preparation: A boule of pure Czochralski (CZ) silicon (monocrystalline), obtained from MEMC, Inc. and having 0.3 ppma of boron, was cut down along its length using a diamond coated band saw so that it had a square cross section measuring from 140 mm per side. The resulting block of monocrystalline silicon was cut through its cross section using the same saw into slabs having a thickness of about 2 cm to about 3 cm. These slabs were used as monocrystalline silicon seed crystals, or "seeds." The (100) crystallographic pole orientation of the silicon boule was maintained. The resulting single crystal silicon slabs were then arranged in the bottom of a quartz crucible so that the (100) direction of the slabs faced up, and the (110) direction was kept parallel to one side of the crucible. The quartz crucible had a square cross section with 68 cm on a side and a depth of about 40 cm. The slabs were arranged in the bottom of the crucible with their long dimension parallel to the bottom of the crucible and their sides touching to form a single, complete layer of such slabs on the bottom of the crucible.

Casting: The crucible was loaded with the seed plates and then filled up to a total mass of 265 kg of solid silicon feedstock at room temperature. A few wafers of highly boron doped silicon were added to provide enough boron for a total ingot doping of ~0.3 ppma. The filled crucible was first surrounded with graphite support plates that rested on the thermally insulating portion of the support structure, and was then loaded into an in-situ melting/directional solidification casting station used to cast multi-crystalline silicon. The melt process was run by heating resistive heaters to approximately 1550° C., and the heaters were configured so that the heating came from the top while heat was allowed to radiate out the bottom by opening the insulation a total of 6 cm. This configuration caused the melting to proceed in a top-down direction towards the bottom of the crucible. The passive cooling through the bottom caused the seed crystals to be maintained in solid state at the melting temperature, as was monitored by a thermocouple. The extent of melting was measured by a quartz dip rod that was lowered into the melt every ten minutes. The dip rod height was compared with a measurement taken on an empty crucible in the station to determine the height of the remaining solid material. By dip rod measurement, first the feedstock melted, and then the melting phase was allowed to continue until only a height of about 1.5 cm of the seed crystals remained. At this point, the heating power was dropped to a temperature setting of 1500° C., while the radiation from the bottom was increased by opening the insulation to 12 cm. One or two additional millimeters of seed crystals melted before solidification began, as observed by dip-rod measurements. Then seeded single crystal growth proceeded until the end of the solidification step. The growth stage and the remainder of the casting cycle were performed with the normal parameters where the top-to-bottom thermal gradient is evened out, and then the entire ingot is slowly cooled to room temperature. The cast silicon product was a 66 cm by 66 cm by 24 cm ingot. The region of crystallinity consistent with the seeds began at the bottom and conformed with the edge of the unmelted material, and from there grew laterally outwards toward the crucible walls as growth began, and stabilized to a constant size towards the end of crystallization. The monocrystalline silicon structure was evident from visually inspecting the faces of bricks cut from the ingot.

EXAMPLE 2

Seeding was accomplished as in Example 1, and an ingot was cast containing a large monocrystalline volume. After cooling, the ingot was stood on its side and loaded into a band saw with fixed diamond abrasive for cutting. The bottom of the ingot was cut off as a single layer with a thickness of 2 cm. This layer was then fixed horizontally on a cutting table. In the same band saw, the edges of the layer were trimmed such that approximately 1.5 cm was removed from each side. The slab was then sandblasted to remove glue and foreign materials, after which it was etched in a hot sodium hydroxide bath, rinsed, and dipped in a HCl bath to remove metals. The slab was then placed on the bottom of a standard crucible of the same size as the previous ingot. Silicon feedstock was loaded to a total mass of 265 kg and the casting process was repeated, producing a second seeded ingot.

EXAMPLE 3

Seed preparation: A seed layer was prepared, starting with 18 kg of square, (100), plates used to line the bottom of a crucible, providing a coverage area of 58 by 58 cm and a thickness ranging from 2-3 cm. These plates were placed together into a larger square that was centered in the crucible. Next, this square was surrounded by a 2 cm thick layer of (111) oriented seed crystals, making the total seed layer a 63 cm by 63 cm square.

Casting: The crucible containing the seeds was filled with silicon to a total mass of 265 kg and placed in a casting station. Casting was performed as in Example 1, monitoring the process to assure that the seed layer remained intact through the end of melt and beginning of solidification. The resulting ingot was cut into a 5×5 grid of 12.5 cm bricks. Optical inspection of the crystal structure of the bricks showed that the (111) crystals acted as a buffer layer, preventing the ingress of randomly nucleated grains into the (100) volume.

EXAMPLE 4

Crucible preparation: A standard 69 $cm^2$ crucible was placed on a support structure composed of two layers. The layers were composed as in Example 1 except that the dimensions of the composite layer were different. The bottom solid graphite layer had dimensions of 80×80×2.5 $cm^3$ as before, but the heat conducting portion of the composite layer measured only 20×20×1.2 $cm^3$, centered on top of the bottom layer. The remainder of the bottom layer was covered with heat insulating graphite fiber board.

Seed preparation: A single piece of (100)-oriented single crystal silicon with a size of 21 cm by 21 cm by 2 cm was centered in the bottom of the crucible. The crucible was then filled with a balance of silicon feedstock to a total mass of 265 kg.

Casting: The crucible and support plates were placed in a casting station and cycled as in Example 1, except that additional time was allowed for the solidification of the silicon, given the smaller heat extraction area. After cooling down, the ingot was sectioned. Visual inspection of the sectioned ingot verified the strong outwards growth of the crystals from the controlled heat extraction.

EXAMPLE 5

Crucible preparation: A standard 69 $cm^2$ crucible was placed on a graphite support plate and loaded with a seed layer, feedstock and dopant as in Example 1, except that the feedstock contained no silicon recycled from previous ingots. A fused silica lid that had dimensions of 69×69×12 $cm^3$ was then placed on the crucible. A casting station was modified such that a telescoping tube was attached to the hole in the top insulation where the process gas is introduced. The charge was then loaded into the station and raised up to engage the telescope. The casting station was run using an altered recipe to allow better gas control and altered solidification settings to compensate for the effects of the crucible lid. The resulting ingot was measured to have $\frac{1}{10}$ of the carbon concentration found in a typical ingot, and additionally had a mirror-like top surface and fewer included foreign particles than typical ingots.

EXAMPLE 6

Crucible preparation: A standard 69 $cm^2$ crucible without a release coating was prepared.

Seed preparation: A single piece of (100)-oriented single crystal silicon was centered in the bottom of the crucible. Additional seed slabs were then added to the four sidewalls of the crucible. The crucible was then filled with a balance of silicon feedstock.

Figure 10:
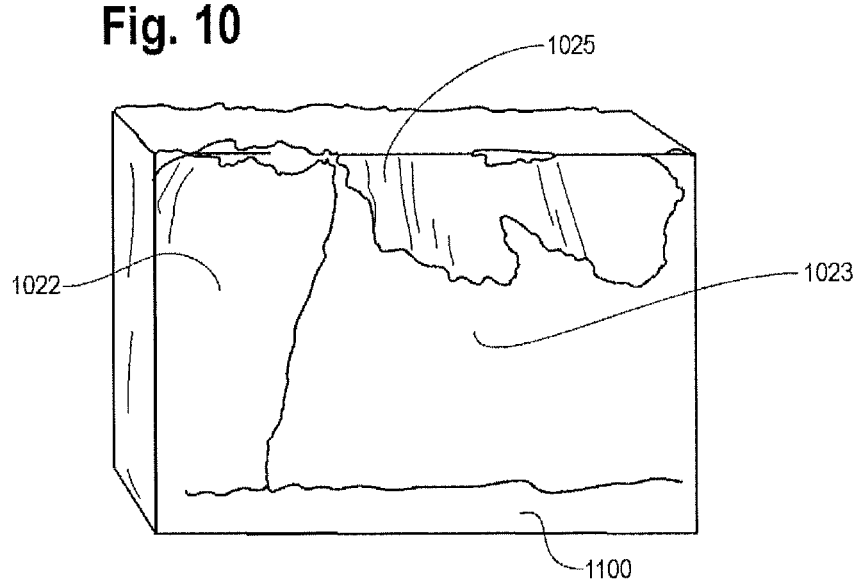
FIG. 10 illustrates an exemplary cast ingot of silicon, according to embodiments of the present invention.

Casting: The crucible and the seed materials were placed in a casting station and cycled through the melt and solidification process including extracting heat through the sidewalls. Visual inspection of the sectioned ingot 1025 verified the desirable effect of the side seed slabs resulting in monocrystalline material 1022 along the side as shown in FIG. 10. The bottom seed layer 1100 oxidized during melting resulting in multicrystalline material 1023 in the center portion of the ingot.

Thus, consistent with embodiments of the invention and the examples described above, wafers made from the silicon consistent with embodiments of the invention are suitably thin and can be used in photovoltaic cells. For example, wafers can be about 10 microns thick to about 300 microns thick. Further, the wafers used in the photovoltaic cells preferably have a diffusion length ($L_p$) that is greater than the wafer thickness (t). For example, the ratio of $L_p$ to t is suitably at least 0.5. It can, for example, be at least about 1.1, or at least about 2. The diffusion length is the average distance that minority carriers (such as electrons in p-type material) can diffuse before recombining with the majority carriers (holes in p-type material). The $L_p$ is related to the minority carrier lifetime τ through the relationship $L_p=(D\tau)^{1/2}$, where D is the diffusion constant. The diffusion length can be measured by a number of techniques, such as the Photon-Beam-Induced Current technique or the Surface Photovoltage technique. See for example, "Fundamentals of Solar Cells", by A. Fahrenbruch and R. Bube, Academic Press, 1983, pp. 90-102, which is incorporated by reference herein, for a description of how the diffusion length can be measured.

The wafers can have a width of about 100 millimeters to about 600 millimeters. Preferably, the wafers have at least one dimension being at least about 50 mm. The wafers made from the silicon of the invention, and consequently the photovoltaic cells made by the invention can, for example, have a surface area of about 100 to about 3600 square centimeters. The front surface of the wafer is preferably textured. For example, the wafer can be suitably textured using chemical etching, plasma etching, or laser or mechanical scribing. If a monocrystalline wafer is used, the wafer can be etched to form an anisotropically textured surface by treating the wafer in an aqueous solution of a base, such as sodium hydroxide, at an elevated temperature, for example about 70° C. to about 90° C., for about 10 to about 120 minutes. The aqueous solution may contain an alcohol, such as isopropanol.

Thus, solar cells can be manufactured using the wafers produced from cast silicon ingots according to the embodiments of the invention, by slicing the solid body of cast silicon to form at least one wafer; optionally performing a cleaning procedure on a surface of the wafer; optionally performing a texturing step on the surface; forming a p-n junction by doping the surface; optionally depositing an anti-reflective coating on the surface; optionally forming a back surface field with, for example, an aluminum sintering step; and forming electrically conductive contacts on at least one surface of the wafer.

In a typical and general process for preparing a photovoltaic cell using, for example, a p-type silicon wafer, the wafer is exposed on one side to a suitable n-dopant to form an emitter layer and a p-n junction on the front, or light-receiving side of the wafer. Typically, the n-type layer or emitter layer is formed by first depositing the n-dopant onto the front surface of the p-type wafer using techniques commonly employed in the art such as chemical or physical deposition and, after such deposition, the n-dopant, for example, phosphorus, is driven into the front surface of the silicon wafer to further diffuse the n-dopant into the wafer surface. This "drive-in" step is commonly accomplished by exposing the wafer to high temperatures. A p-n junction is thereby formed at the boundary region between the n-type layer and the p-type silicon wafer substrate. The wafer surface, prior to the phosphorus or other doping to form the emitter layer, can be textured. In order to further improve light absorption, an anti-reflective coating, such as silicon nitride, is typically applied to the front of the wafer, sometimes providing simultaneous surface and or bulk passivation.

In order to utilize the electrical potential generated by exposing the p-n junction to light energy, the photovoltaic cell is typically provided with a conductive front electrical contact on the front face of the wafer and a conductive back electrical contact on the back face of the wafer, although both contacts can be on the back of the wafer. Such contacts are typically made of one or more highly electrically conducting metals and are, therefore, typically opaque.

Thus, solar cells consistent with the embodiments described above may comprise a wafer sliced from a body of continuous monocrystalline silicon being substantially free of radially-distributed defects, the body having at least two dimensions each being at least about 35 cm, a p-n junction in the wafer, an anti-reflective coating on a surface of the wafer; and a plurality of electrically conductive contacts on at least one surface of the wafer, wherein the body is substantially free of swirl defects and substantially free of oxygen-induced stacking fault defects.

Also, solar cells consistent with the embodiments described above may comprise a wafer sliced from a body of continuous multi-crystalline silicon being substantially free of radially-distributed defects, the body having a predetermined arrangement of grain orientations with a common pole direction being perpendicular to a surface of the body, the body further having at least two dimensions each being at least about 10 cm, a p-n junction in the wafer; an anti-reflective coating on a surface of the wafer, and a plurality of electrically conductive contacts on at least one surface of the wafer, wherein the multi-crystalline silicon includes silicon grains having an average grain boundary length of about 0.5 cm to about 30 cm, and wherein the body is substantially free of swirl defects and substantially free of oxygen-induced stacking fault defects.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered exemplary only, with a true scope and spirit of the invention being indicated by the following claims.

We claim:

1. A method of manufacturing cast silicon, comprising:
   loading a bottom seed layer of crystalline silicon on a bottom of a crucible;
   loading at least one side plate seed layer of crystalline silicon next to at least one side wall of the crucible;
   covering the crucible with a lid; introducing liquid silicon into the crucible; melting a part of the bottom seed layer and/or the at least one side plate seed layer;
   forming a solid body of silicon; flowing an inert gas through at least one hole in the lid; expelling the inert gas through at least one other hole; and
   cooling the solid body.

2. The method according to claim 1, wherein the forming a solid body comprises extracting heat through a bottom surface of the crucible.

3. The method according to claim 1, wherein the forming a solid body comprises extracting heat through a bottom surface and at least one side wall of the crucible.

* * * * *